(12) United States Patent
Shin et al.

(10) Patent No.: US 7,175,941 B2
(45) Date of Patent: Feb. 13, 2007

(54) PHASE SHIFT ASSIGNMENTS FOR ALTERNATE PSM

(75) Inventors: Jaw-Jung Shin, Hsin Chu (TW); Jan-Wen You, Jhongli (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 571 days.

(21) Appl. No.: 10/657,503

(22) Filed: Sep. 8, 2003

(65) Prior Publication Data

US 2005/0053846 A1    Mar. 10, 2005

(51) Int. Cl.
*G03F 1/00* (2006.01)
*G06F 17/50* (2006.01)

(52) U.S. Cl. .......................... 430/5; 716/21
(58) Field of Classification Search .......... 430/5; 403/311–313; 716/19–21
See application file for complete search history.

(56) References Cited

U.S. PATENT DOCUMENTS

| | | | |
|---|---|---|---|
| 6,057,064 A | 5/2000 | Lin | 430/5 |
| 6,249,904 B1 | 6/2001 | Cobb | 716/21 |
| 6,303,252 B1 | 10/2001 | Lin | 430/5 |
| 6,312,856 B1 | 11/2001 | Lin | 430/5 |
| 6,396,158 B1 | 5/2002 | Travis et al. | 257/784 |
| 6,534,221 B2 * | 3/2003 | Lee et al. | 430/5 |
| 6,635,388 B1 * | 10/2003 | Friedrich et al. | 430/5 |
| 6,811,935 B2 * | 11/2004 | Pierrat | 430/5 |
| 2003/0198872 A1 * | 10/2003 | Yamazoe et al. | 430/5 |

* cited by examiner

*Primary Examiner*—S. Rosasco
(74) *Attorney, Agent, or Firm*—Thomas, Kayden, Horstemeyer & Risley (57) ABSTRACT

Prior art methods for forming alt. PSMs require a relatively large number of phase assignments to avoid phase conflicts in complex arrays. This has been improved by adding dummy elements at the ends of all rows and columns of the array that is to be imaged, while initially leaving all corners open. Phases are then assigned in checker board fashion to all elements. Additional dummy elements are then placed in the open corners and assigned the same phase as their immediate neighbors. The first exposure of the photoresist is made with both the original elements and the additional dummy elements. Then additional resist is coated and exposed and the original elements are open after development. If the added elements are made somewhat smaller than the original elements, only a single exposure is used.

38 Claims, 6 Drawing Sheets

PHASE SHIFT ASSIGNMENTS FOR ALTERNATE PSM

FIELD OF THE INVENTION

The invention relates to the general field of photolithography with particular reference to phase difference between alternating elements on a reticle.

BACKGROUND OF THE INVENTION

As the critical dimensions of the elements that make up integrated circuits approach, and grow smaller than, the wavelength of the radiation used to form photolithographic images, various strategies have been developed to deal with the problem of how to continue resolving these elements from one another in the final images. One of the most successful approaches to the problem has been phase shifting masks.

The basic notion behind such masks is to eliminate or reduce the diffraction fringes that are generated immediately alongside any opaque edge. Since these fringes arise from Huygen's wavelets being alternately in and out of phase, they can be changed, and thus reduced, if the phase of the light in the immediate vicinity of an edge is changed. Thus, in the alternating phase shift mask (APSM), the phase of light that passes just outside the edge of an element that is to be imaged is shifted by 180 degrees and the diffraction fringe that would normally be there is eliminated.

Figure 1:
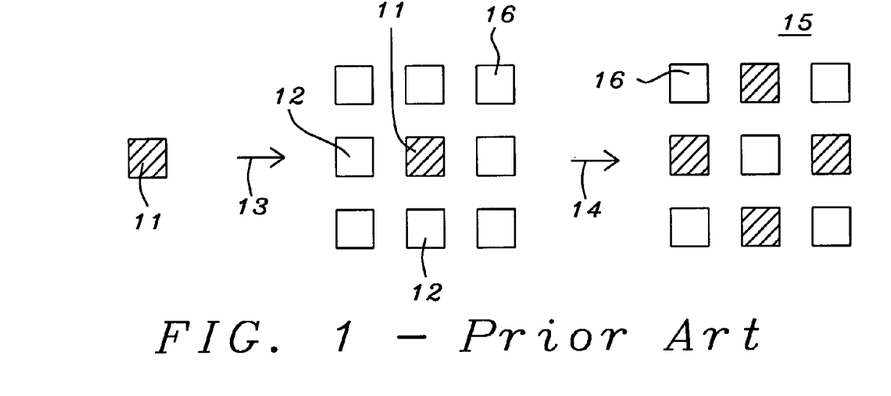
FIGS. 1 and 2 illustrate methods of the prior art for preparing Alt PSMs for isolated and dense hole patterns respectively.

In FIG. 1 we illustrate how, in the prior art, an APSM is formed for a single element 11 in the shape of a rectangle or a circle, such as might be intended to serve as a contact hole within an integrated circuit. The first step (symbolized by arrow 13) is to surround 11 with a ring of 'dummy' elements such as 12. This includes the placement of elements, such as 16, in the corners. The third step (arrow 14) is to assign phases (either zero or 180 degrees) for the light that will emerge after passing through elements 12. This is done by assigning phases in checker board fashion, as seen in the final arrangement 15, where the two phase types are symbolized by light and dark squares.

It should be noted that the way FIG. 1, and subsequent similar figures, are drawn is intended to depict transparent elements on an opaque background (necessitating the use of positive resists during photolithography), so neighboring elements transmit the same amount of light (i.e. approximately 100%) but the phases of the emerging beams differ by 180 degrees. It is also important to note that, in this scheme, the phase assigned to any given element is arbitrary just so long as the phases have been assigned in a checker board fashion.

Figure 2:
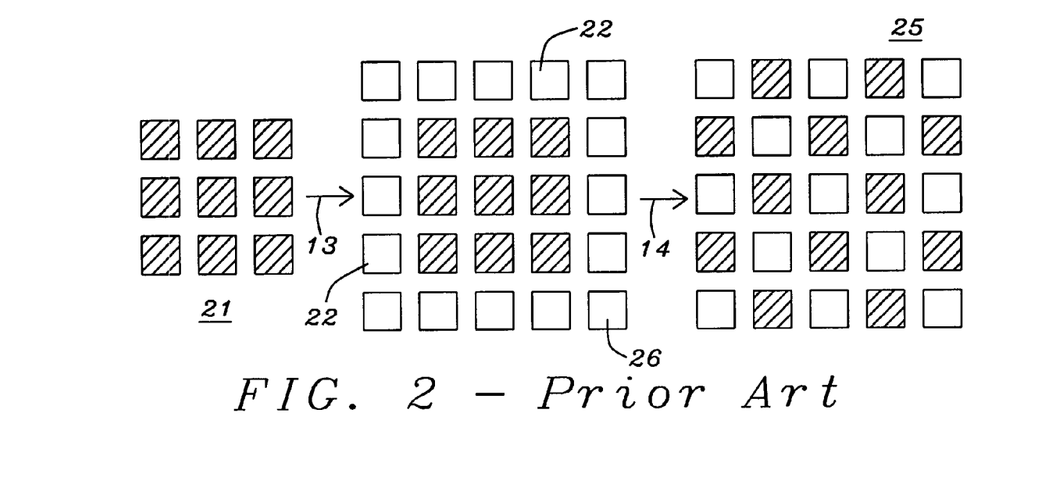

The prior art procedure for designing masks for a densely packed set of elements is illustrated in FIG. 2. Starting with array of elements 21 (nine in this example), a ring of 'dummy' elements such as 22 is placed to surround the original nine elements. As before, this includes elements such as 26 in the corners. Also as before, phases are assigned to the final pattern 25 in a checker board fashion.

Figure 3:
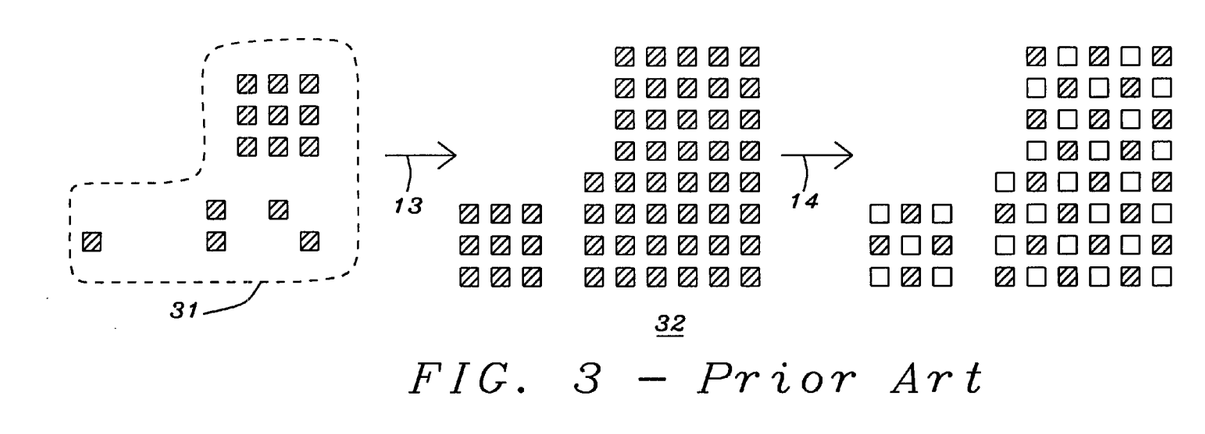
FIGS. 3 and 4 depict two algorithms used by the prior art to prepare Alt PSMs for complex hole patterns.

While these prior art algorithms work well enough for the simple examples used to illustrate them, several problems arise when they are applied to the more complex distributions of elements that are to be found in real circuit layouts. For example, in FIG. 3 we show typical layout 31 of fourteen contact holes. Following the procedures described above, the array has been expanded to become array 32 which contains fifty four elements, to all of which phases must now be assigned. When this procedure is followed for a full wafer layout, the number of required phase assignments can become quite large.

Figure 4:
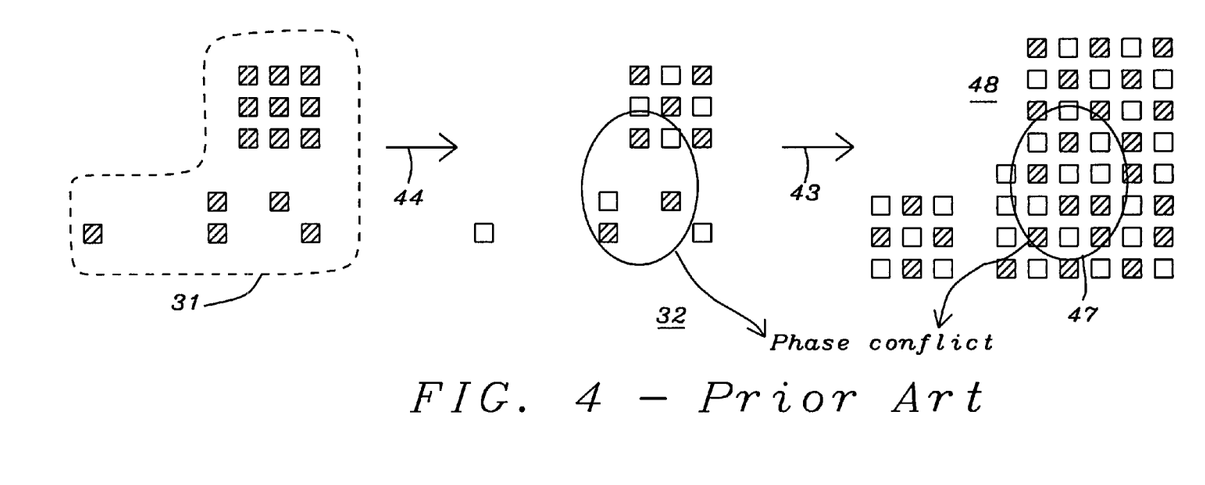

In order to reduce the number of required phase assignments, the prior art has also been using an alternative algorithm which is illustrated in FIG. 4. In this scheme, phases are assigned to the original elements first (arrow 44). Only then are the dummy elements added (arrow 43). The latter are then assigned alternating phases (as before). With this scheme, however, a problem can arise in the form of a conflict between the earlier assigned phases 46 and the later assigned phases 47. As can be seen in the rightmost array shown in FIG. 4, for the third and fourth rows from the bottom, the checkerboard assignment could not be maintained.

The present invention describes an array, and method for its formation, that requires both fewer phase assignment decisions to be made and is free from possible phase conflicts.

A routine search of the prior art was performed with the following references of interest being found:

In U.S. Pat. No. 6,249,904 B1, Cobb shows a process to correct edge placement distortion while Lin describes a double alternating PSM in U.S. Pat. No. 6,057,064. Travis et al., in U.S. Pat. No. 6,396,158 B1, show a mask process including assist features. U.S. Pat. No. 6,312,856 B1 (Lin) also reveals a PSM with assist features.

SUMMARY OF THE INVENTION

It has been an object of at least one embodiment of the present invention to provide an alternate phase shift mask suitable for projecting images of holes.

Another object of at least one embodiment of the present invention has been has been to provide a method for producing said mask.

Still another object of at least one embodiment of the present invention has been that said method and the resulting masks be useful for isolated holes, densely packed holes, and arbitrary mixes of isolated and densely packed holes.

A further object of at least one embodiment of the present invention has been that said masks, produced according to the teachings of the present invention, provide an increased depth of focus and a reduced sensitivity to phase errors relative to masks for the same hole patterns produced according to the teachings of the prior art.

These objects have been achieved by adding dummy elements at the ends of all rows and columns of the array that is to be imaged, while initially leaving all corners open. Phases are then assigned in checker board fashion to all elements following which additional dummy elements are then placed in the open corners and assigned the same phase as their immediate neighbors.

DESCRIPTION OF THE PREFERRED EMBODIMENTS

Figure 5:
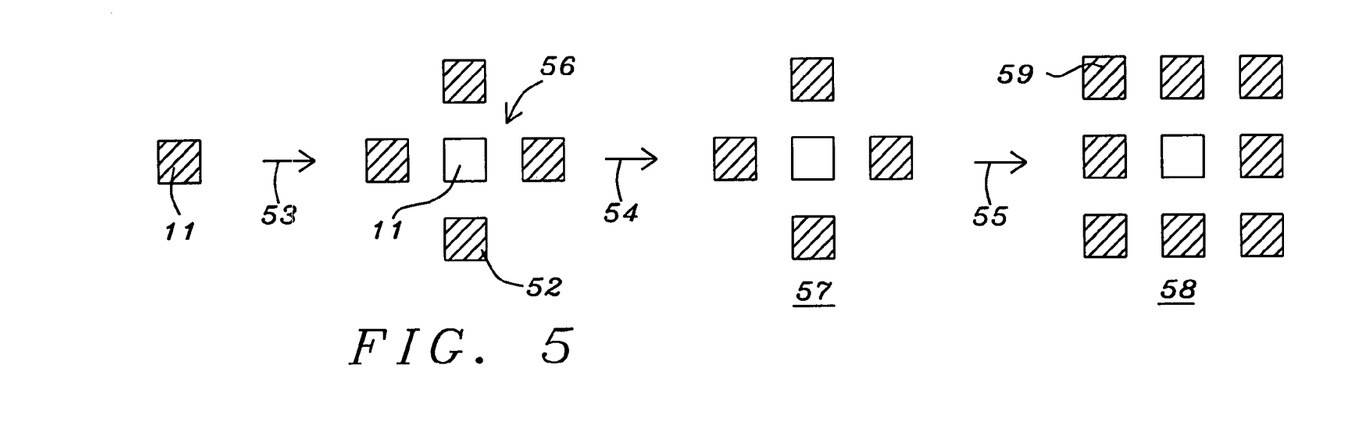
FIGS. 5 and 6 illustrate methods of the present invention for preparing Alt PSMs for isolated and dense hole patterns respectively.

We refer now to FIG. 5 for a description of the method taught by the present invention. As before, our first example is for a single element 11. The first step (arrow 53) is to surround element 11 with dummy elements such as 52. However, in an important departure from the prior art, all corners, such as 56, are left vacant. Phases are now assigned to the dummy elements (arrow 54) so that any two adjacent elements in a given row as well as any two adjacent elements in a given column have opposite phases. The result, is a checker board of alternating phases, said checker board lacking elements in the corners. This is seen as array 57.

Assignment of phase can be achieved in one of two ways, both of which involve adjusting the optical thickness of one set of elements relative to the others. Our preferred way has been to decrease the thickness of the relevant elements, through dry etching and wet etching, while monitoring the phase of light transmitted through them. It is, however, also possible to adjust phase by increasing the optical thickness of the relevant elements. Since a higher refractive index material than that constituting the reticle can be used, there is less effect on the planarity of the reticle surface. Also, the deposition of additional material allows for the introduction grey scale elements, should these be desired.

Finally, dummy elements (such as 59) are placed in each of the open corners and their phases assigned. In another important departure from the prior art, these phases are assigned to be the same as that of their two closest neighbors. The result is array 58 which is to be contrasted with array 15 of FIG. 1

Figure 6:
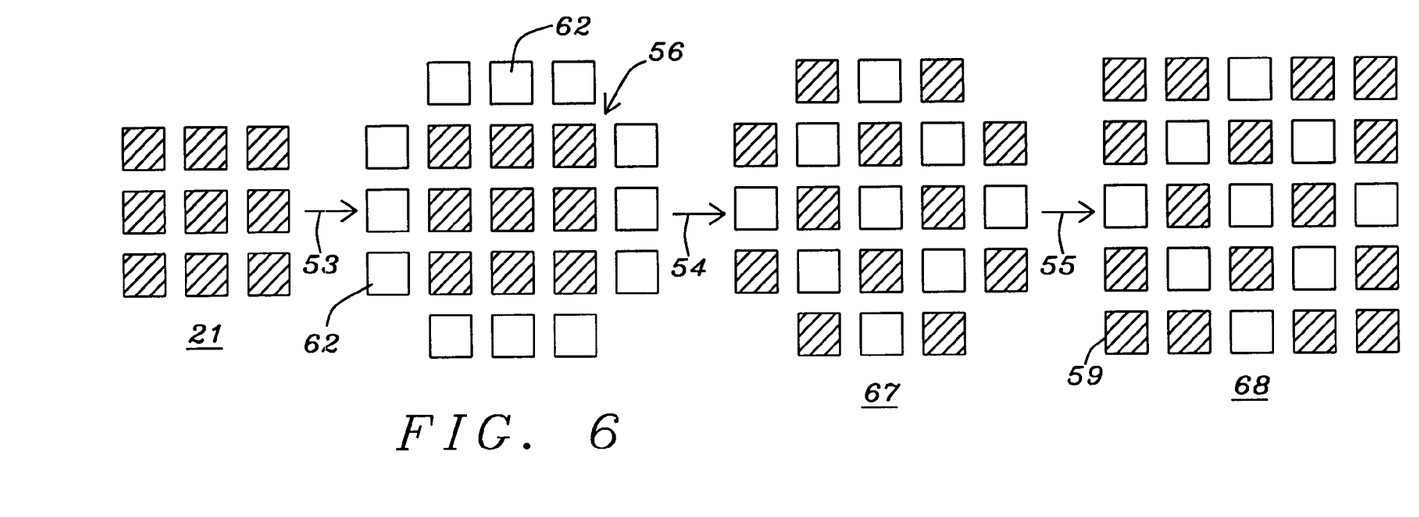

The same method is similarly applicable to arrays of more than one element, as exemplified in FIG. 6. As before, dummy elements such as 62 are placed at the ends of each row and column but the corners 56 remain open. Then, also as before, phases are assigned to these dummy elements so they have alternating values along both rows and columns (arrow 54) resulting in array 67. Finally, again as before, dummy elements (such as 59) are placed in each of the open corners and their phases assigned to be the same as that of their two closest neighbors. The result is array 68 which is to be contrasted with array 25 of FIG. 2.

Figure 7:
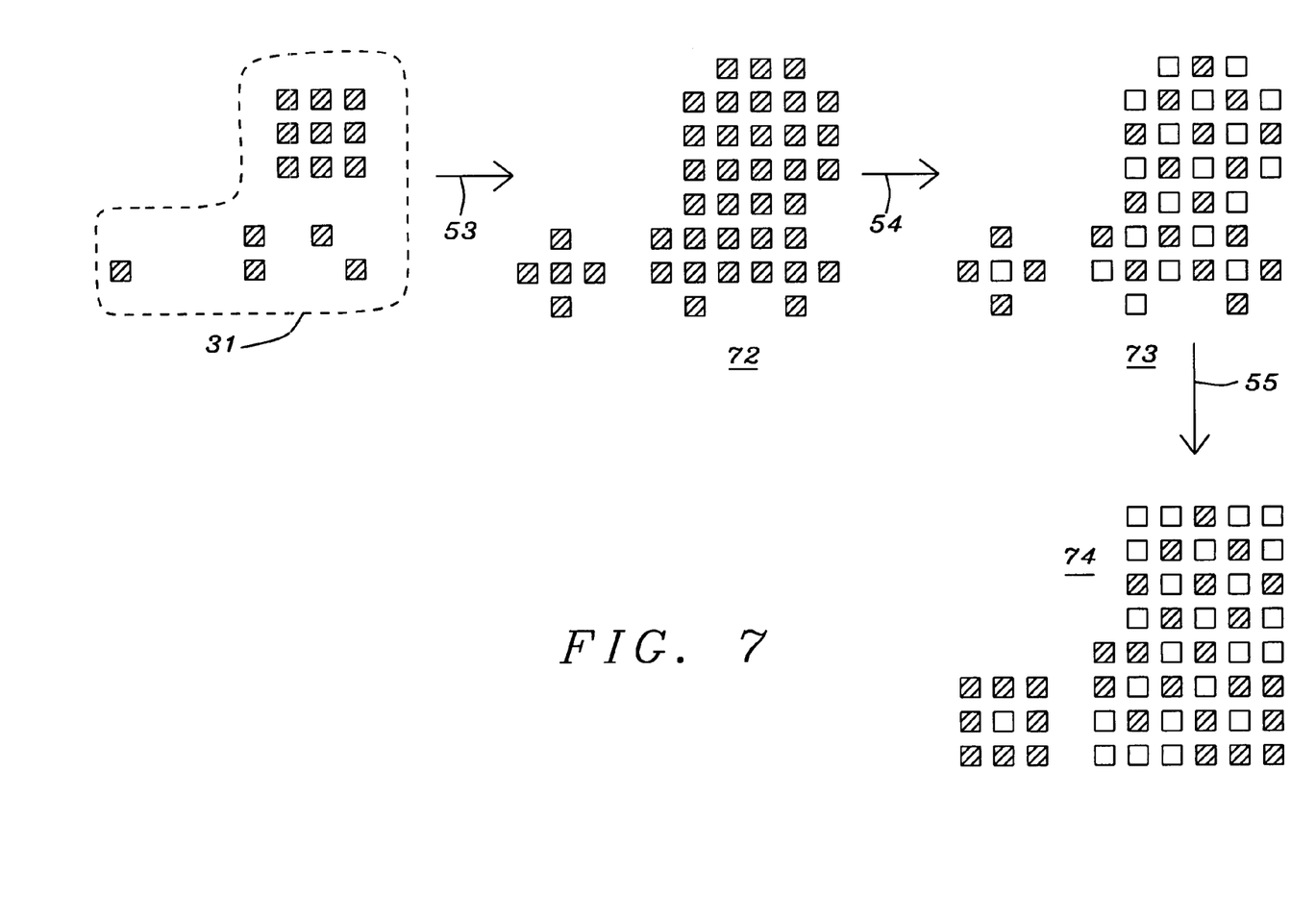
FIG. 7 illustrates the algorithm taught by the present invention for the preparation of Alt PSMs for complex hole patterns.

We may effectively compare the method of the present invention with the prior art by following the steps needed to form a PSM from complex array 31 last seen in FIG. 4. Referring now to FIG. 7, following the steps just described above, dummy elements are added to the ends of all rows and columns, but with the corners left empty, the result being array 72. Phases that alternate along the rows and columns of 72 are then assigned, resulting in array 73. We note here that only forty phase assignments had to be made, as opposed to fifty three using the prior art method that is guaranteed to be free of phase conflicts.

Finally, proceeding along arrow 55 in FIG. 7, dummy elements are placed in all open corners and assigned to have the same phases as their immediate neighbors, resulting in array 74.

To transfer an image of an array such as 31 to photoresist, two exposures are normally used. In the first exposure, a reticle bearing the array pattern (58, 68, or 74 in FIGS. 5, 6, or 7 respectively) is used following which there is a second exposure through a reticle pattern made up of the original pattern with positive bias (11, 21, or 31 in FIGS. 5, 6, or 7 respectively).

It is also possible in certain cases to manage with only a single exposure. This is because, for arrays formed in this way, the DOF (depth of focus) for the original elements within the PSM array turns out to be significantly greater than that of the peripheral elements that were added to form the PSM as long as the added dummy elements are somewhat smaller in size than the originals (typically between about 50 and 95% shorter on each side). So, for a relatively thick layer of photoresist, the thinner image of the peripheral elements that is formed inside the resist layer will not survive the development process.

Through both simulation and experiment, we have determined that full resolution of contact or via holes having a critical dimension of about 0.1 microns can be obtained. in photoresist images that were obtained when using radiation having a wavelength of 0.193 microns.

Figure 8A:
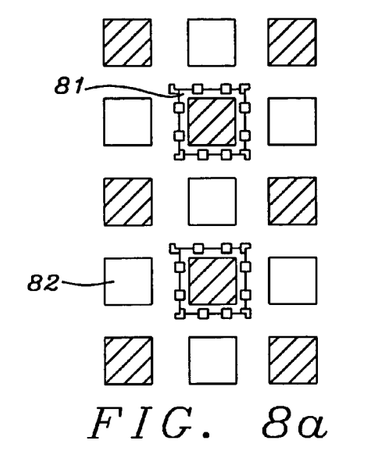
FIGS. 8*a* and 8*b* compare depth of focus results for PSMs prepared according to the prior art and to the present invention, respectively.
Figure 8B:
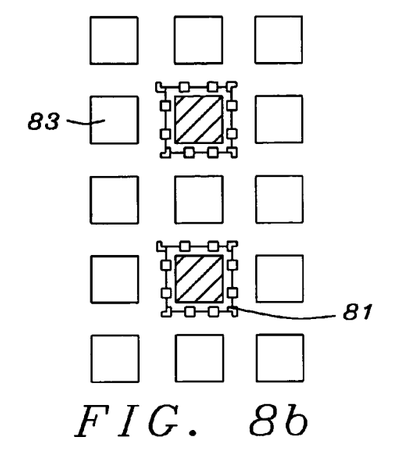

As already noted, the depth of focus for the original elements in the pattern can be greater than that of the dummy elements. This is illustrated in FIGS. 8*a* and 8*b*. FIG. 8*a* shows a pattern, made according to the prior art, for imaging a pair of via holes. In FIG. 8*a*, the DOF for original elements such as 81 and for added elements such as 82 was the same, namely 0.34 microns. In FIG. 8*b*, the DOF for peripheral elements such as 83 was less than about 0.1 micron. However, for original elements such as 81, a DOF of 0.61 microns was achieved.

Figure 9:
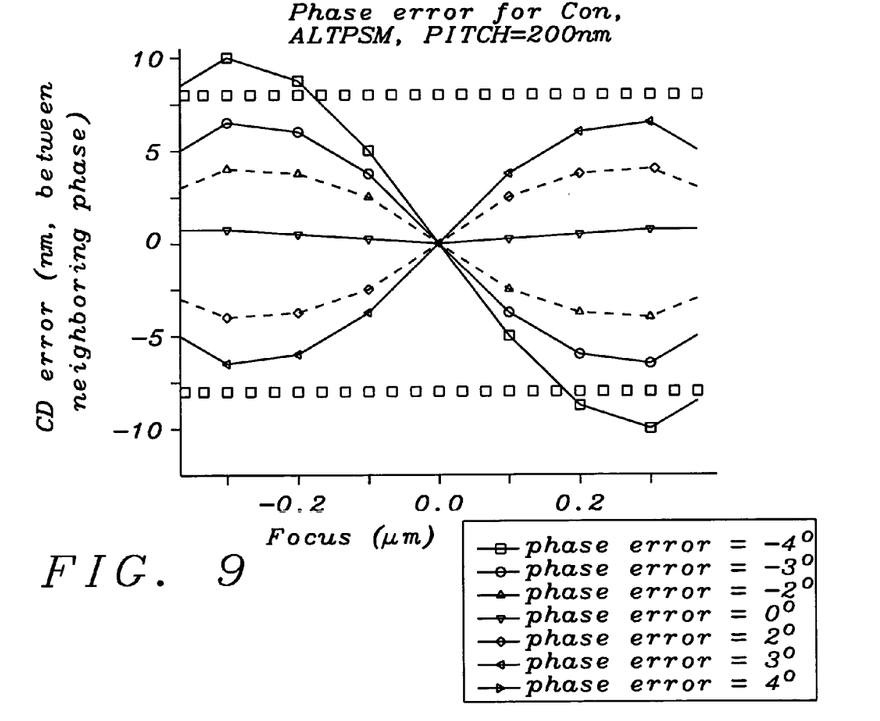
FIGS. 9 and 10 are plots of CD errors between neighboring elements arising from phase errors in those elements, for Alt. PSMs of the prior art and present invention, respectively.
Figure 10:
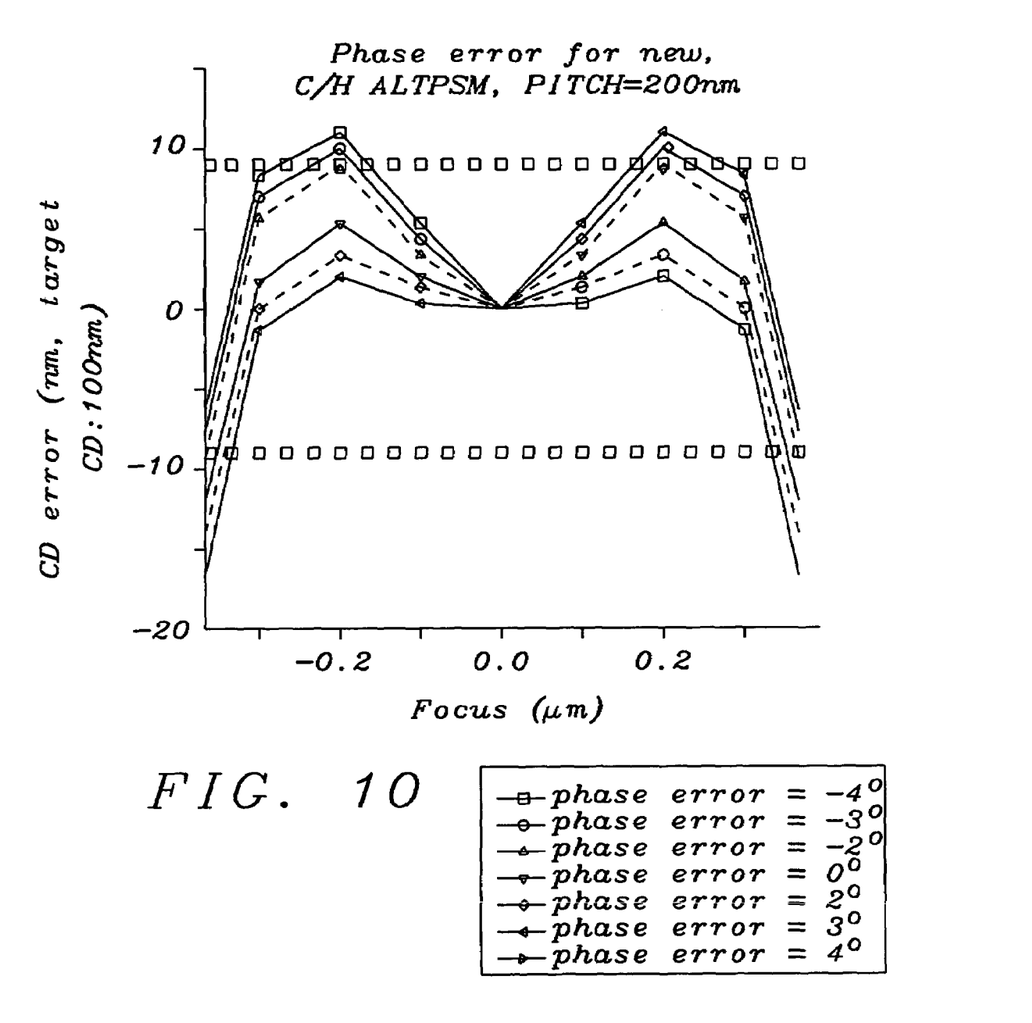

An additional advantage of the present invention is that it leads to less sensitivity to phase errors (departures from the zero or 180 degree phase difference that was intended for a given element). Data to illustrate this is shown in FIGS. 9 and 10. These curves are plots of CD errors between neighboring elements arising from phase errors in those elements, in FIG. 9 for alt. PSMs of the prior art (as seen in FIG. 1) and, in FIG. 10, of the present invention (as seen in FIG. 5). As can be seen, in the prior art designs, CD errors increase rapidly on either side of the plane of best focus and exceed acceptable limits starting at about 0.2 microns on either side of said plane. In contrast, in the designs of the present invention, CD error is relatively insensitive to small phase errors over a range of about 0.3 microns on either side of the central focal plane. The reason the design of the present invention is less sensitive to phase errors is because all adjacent elements, including the dummy elements, have opposite phases.

What is claimed is:

1. A method to form, on a reticle, a final pattern of an array of first elements, each of which has an optical thickness, comprising: forming a first pattern of said array on said reticle; adding additional second elements, that are between about 50 and 150% of said first elements, to said first pattern so that one second element is added to each end of each row of said array and one second element is added to each end of each column of said array; and adjusting said optical thickness for each element whereby any two adjacent elements in a given row and any two adjacent elements in a given column transmit light beams that have a relative phase difference of 180 degrees, thereby forming said final pattern.

2. The method described in claim 1 wherein said elements are rectangles.

3. The method described in claim 1 wherein said elements are circles.

4. The method described in claim 1 wherein said elements represent contact holes.

5. The method described in claim 1 wherein said first pattern contains only one element.

6. The method described in claim 1 wherein the step of adjusting said optical thickness further comprises decreasing thickness for a given element.

7. The method described in claim 1 wherein the step of adjusting said optical thickness further comprises increasing thickness for a given element.

8. A method to form, in a layer of photoresist, an image of an array of first elements, each of which has a linear dimension, comprising: providing a source of light whose wavelength is within about 200% of said linear dimension; forming a first pattern of said array on a reticle; adding additional second elements, that are between about 50 and 150% of said first elements to said first pattern so that one second element is added to each end of each row of said array and one element is added to each end of each column of said array; adjusting each element's optical thickness so that any two adjacent elements in a given row and any two adjacent elements in a given column transmit light beams that have a relative phase difference of 180 degrees, thereby forming a second pattern; using said light source and an imaging system, projecting an image of said second pattern onto said layer of photoresist; and then developing the photoresist, thereby forming therein an image of said first pattern.

9. The method described in claim 8 wherein said elements are rectangles.

10. The method described in claim 8 wherein said elements are circles.

11. The method described in claim 8 wherein said elements represent contact holes.

12. The method described in claim 8 wherein said first pattern contains only one element.

13. The method described in claim 8 wherein the step of adjusting said optical thickness further comprises decreasing thickness for a given element.

14. The method described in claim 8 wherein the step of adjusting said optical thickness further comprises increasing thickness for a given element.

15. The method described in claim 8 wherein said linear dimension is between about 0.09 and 0.03 microns.

16. A method to form, on a reticle, a final pattern of an array of elements, each of which has an optical thickness, comprising: forming a first pattern of said array on said reticle; adding additional elements to said first pattern so that one element is added to each end of each row of said array and one element is added to each end of each column of said array; adjusting said optical thickness for each element whereby any two adjacent elements in a given row and any two adjacent elements in a given column transmit light beams that have a relative phase difference of 180 degrees, thereby forming a second pattern of an array having open corners; adding to said second pattern one new element at each of said open corners; and adjusting said optical thickness for each new element whereby it transmits light having zero phase difference relative to light transmitted by its two closest neighbors.

17. The method described in claim 16 wherein said elements are rectangles.

18. The method described in claim 16 wherein said elements are circles.

19. The method described in claim 16 wherein said elements represent contact holes.

20. The method described in claim 16 wherein said first pattern contains only one element.

21. The method described in claim 16 wherein the step of adjusting said optical thickness further comprises decreasing thickness for a given element.

22. The method described in claim 16 wherein the step of adjusting said optical thickness further comprises increasing thickness for a given element.

23. A method to form, in a layer of photoresist, an image of an array of elements, each of which has a linear dimension, comprising: providing a source of light whose wavelength is within about 200% of said linear dimension; forming a first pattern of said array on a reticle; adding additional elements, with sizes between 60% and 95% of those of said first pattern, to said first pattern so that one element is added to each end of each row of said array and one element is added to each end of each column of said array; adjusting each element's optical thickness so that any two adjacent elements in a given row and any two adjacent elements in a given column transmit light beams that have a relative phase difference of 180 degrees, thereby forming a second pattern; then adding to said second pattern an extra element at each of said open corners; adjusting said optical thickness for each extra element to transmit light having zero phase difference relative to light transmitted by its two closest neighbors, thereby forming a third pattern; using said light source and an imaging system, projecting an image of all of said first, second, and third patterns, aligned with said first image, onto said layer of photoresist; and then developing the photoresist, thereby forming therein an image of said first pattern.

24. The method described in claim 23 wherein said elements are rectangles.

25. The method described in claim 23 wherein said elements are circles.

26. The method described in claim 23 wherein said elements represent contact holes.

27. The method described in claim 23 wherein said first pattern contains only one element.

28. The method described in claim 23 wherein the step of adjusting said optical thickness further comprises decreasing thickness for a given element.

29. The method described in claim 23 wherein the step of adjusting said optical thickness further comprises increasing thickness for a given element.

30. The method described in claim 23 wherein said linear dimension of the first pattern is between about 0.09 and 0.15 microns.

31. A method to form a pattern of elements for transfer to a mask, comprising: forming on a reticle a primary pattern of primary elements to which phases have been assigned, said primary pattern having vertical and horizontal edges and corners where said edges intersect; forming a first set of auxiliary elements, on said reticle, disposed to be parallel to said edges and located a fixed distance therefrom; assigning phases to said auxiliary elements whereby each auxiliary element is assigned a phase that is the opposite of that which had been assigned to a primary element closest to it; and then forming, on said reticle, a second set of auxiliary elements located at said corners.

32. An array of elements on a reticle, each element having an optical thickness, comprising: a sub-array of said elements on said reticle, said array having rows, each with two ends, and columns, each with two ends; first additional elements located, one at each end of each row of said sub-array and one at each end of each column of said sub-array; said optical thicknesses being such that any two adjacent elements in a given row and any two adjacent elements in a given column transmit light beams that have a relative phase difference of 180 degrees, said sub-array and said first additional elements forming a second array having open corners; a second additional element being located at each of said open corners; and said optical thicknesses being such that each second additional element transmits light having zero phase difference relative to light transmitted by its two closest neighbors.

33. The array described in claim 32 wherein said elements are rectangles.

34. The array described in claim 32 wherein said elements are circles.

35. The array described in claim 32 wherein said elements represent contact holes.

36. The array described in claim 32 wherein said first array contains only one element.

37. The array described in claim 32 wherein a greater depth of focus is achieved, relative to array of the prior art, when said array is used to produce an image of said sub-array.

38. The array described in claim 32 wherein there is less sensitivity to phase errors relative to an array of the prior art that produces an image of said sub-array.

* * * * *